(12) United States Patent
Chethik

(10) Patent No.: US 6,810,048 B2
(45) Date of Patent: Oct. 26, 2004

(54) VIRTUAL COHERENT SIGNAL CONTROLLED OSCILLATOR

(75) Inventor: Frank Chethik, Palo Alto, CA (US)

(73) Assignee: Lockheed Martin Corp., Bethesda, MD (US)

( * ) Notice: Subject to any disclaimer, the term of this patent is extended or adjusted under 35 U.S.C. 154(b) by 356 days.

(21) Appl. No.: 09/939,446

(22) Filed: Aug. 24, 2001

(65) Prior Publication Data

US 2003/0038684 A1 Feb. 27, 2003

(51) Int. Cl.$^7$ ................................................ H01S 3/10
(52) U.S. Cl. ........................... 372/28; 372/18; 372/32; 372/12; 372/13
(58) Field of Search .......................... 372/28, 18, 12, 372/13

(56) References Cited

U.S. PATENT DOCUMENTS

| | | | | |
|---|---|---|---|---|
| 3,623,105 A | * | 11/1971 | Kamen et al. ............... 455/102 |
| 4,666,255 A | * | 5/1987 | Taylor et al. ................... 385/7 |
| 4,812,035 A | * | 3/1989 | Freedman et al. ......... 356/5.09 |
| 4,912,716 A | * | 3/1990 | Mead ........................... 372/32 |
| 5,289,252 A | * | 2/1994 | Nourrcier ................... 356/5.09 |
| 6,141,141 A | * | 10/2000 | Wood .......................... 359/326 |

* cited by examiner

Primary Examiner—Minsun Oh Harvey
Assistant Examiner—Dung Nguyen
(74) Attorney, Agent, or Firm—Kenneth W. Float

(57) ABSTRACT

A virtual coherent signal controlled laser oscillator for use in optical phase locked coherent receivers. The present invention employs a fixed laser oscillator in combination with a signal controlled microwave oscillator. A single sideband mixer processes the signals output by the laser oscillator and microwave oscillator to generate a single controlled optical frequency signal.

5 Claims, 1 Drawing Sheet

VIRTUAL COHERENT SIGNAL CONTROLLED OSCILLATOR

BACKGROUND

The present invention relates generally to optical phase locked coherent receivers, and more particularly, to a virtual coherent signal controlled laser oscillator for use in optical phase locked coherent receivers.

Conventional optical phase locked coherent receivers have used laser signal controlled oscillators. It has been determined that the FM response of available laser signal controlled oscillators is undesirable and is unsuitable for phase locking of the optical phase locked coherent receiver in which it is used.

It is therefore an objective of the present invention to provide for a virtual coherent signal controlled laser oscillator for use in optical phase locked coherent receivers.

SUMMARY OF THE INVENTION

The present invention provides for a virtual coherent signal controlled laser oscillator for use in optical phase locked coherent receivers. The present invention is intended for use in coherent optical transmitter and receiver systems. In a receiver, the signal controlled laser oscillator may be used as a phase locked laser oscillator, a key element of a coherent optical detector. The shortcoming of currently available signal controlled laser oscillators prevent their use in this application since their response to AC control signals are unsuitable for operation of the phase lock loop. The present invention circumvents this problem by using an implementation that is a combination of a signal controlled microwave oscillator and a fixed laser oscillator.

The present invention has suitable signal controlled (FM) response for use in the optical phase locked coherent receiver, whereas a conventional laser signal controlled oscillator FM response is unsuitable and prevents phase locking.

An exemplary signal controlled laser oscillator comprises a signal controlled laser oscillator that receives a fixed bias input signal and outputs an optical frequency signal $f_0$. A signal controlled microwave oscillator receives a frequency control input signal and outputs a microwave frequency signal, $f_m$. A single sideband mixer processes the signals output by the laser oscillator and microwave oscillator to generate a signal controlled optical frequency signal.

The single sideband mixer may comprise an optical single sideband mixer that includes a zero degree power splitter coupled to an output of the signal controlled laser oscillator, and a ninety degree hybrid coupler coupled to an output of the signal controlled microwave oscillator. First and second optical modulators having first inputs are coupled to first outputs of the power splitter and hybrid coupler, and second inputs are coupled to second outputs of the power splitter and hybrid coupler. An output ninety degree hybrid coupler is coupled to outputs of the first and second optical modulators for outputting upper sideband and lower sideband output signals.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
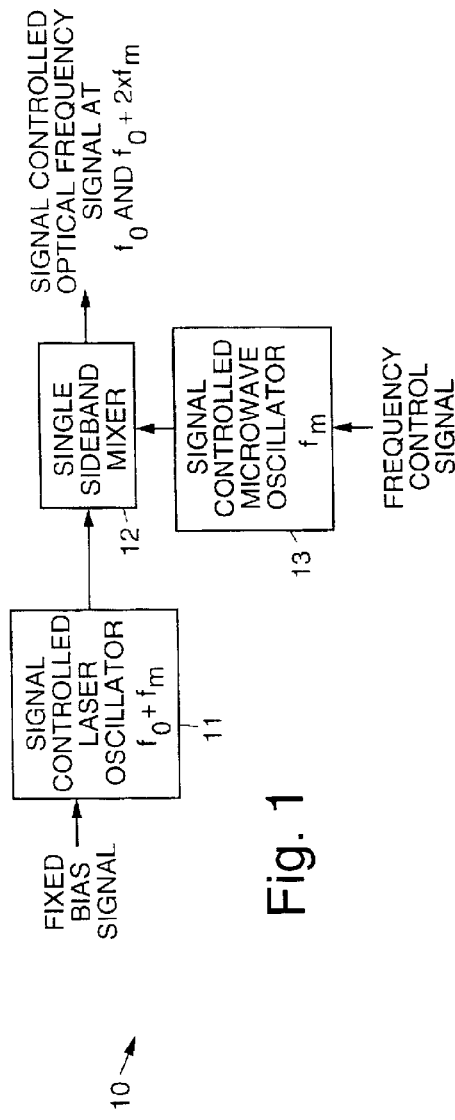
FIG. 1 illustrates a first exemplary embodiment of a virtually coherent signal controlled laser oscillator in accordance with the principles of the present invention.

Referring to the drawing figures, FIG. 1 illustrates a first exemplary embodiment of a virtually coherent signal controlled laser oscillator 10 in accordance with the principles of the present invention. The virtually coherent signal controlled laser oscillator 10 comprises a signal controlled laser oscillator 11 that receives a fixed bias input signal. The output of the signal controlled laser oscillator 11 is coupled to a single sideband mixer 12. A signal controlled microwave oscillator 13 having a frequency control input signal outputs a microwave frequency, $f_m$ that is input to the single sideband mixer 12. The output of the single sideband mixer 12 is a signal controlled optical frequency signal.

If a carrier frequency to which the signal controlled laser oscillator 11 is to be phase locked is defined as $f_o$, the signal controlled laser oscillator 11 is tuned to a frequency offset from $f_o$ by the microwave frequency, $f_m$ generated by the signal controlled microwave oscillator 13. The single sideband mixer 12 combines the outputs of the signal controlled microwave oscillator 13 and signal controlled laser oscillator 11 and generates a controlled output signal at $f_o$. Since the signal controlled laser oscillator 11 is not subject to active control of its frequency within the phase locked control loop, its dynamic response does not prevent phase lock to the signal input to the phase locked loop.

Care must be taken in the selection of fm since several criteria must be met: Where optical filtering is used to suppress the signal controlled laser oscillator output frequency from the single sideband mixer 12, the offset frequency from the desired $f_o$ must be large enough so that the signal controlled laser oscillator output signal at the single sideband mixer 12 is suppressed to the required degree. Further, the signal displaced by $2 \times f_m$ from $f_o$ must also be suppressed. Moreover, the tunability of the signal controlled microwave oscillator 13 must be large enough to compensate all of the optical frequency uncertainties in the transmission system so that the virtually coherent signal controlled laser oscillator 10 functions as required. This includes uncertainties associated with the laser oscillator 11 as well as the signal controlled microwave oscillator 13.

Figure 2:
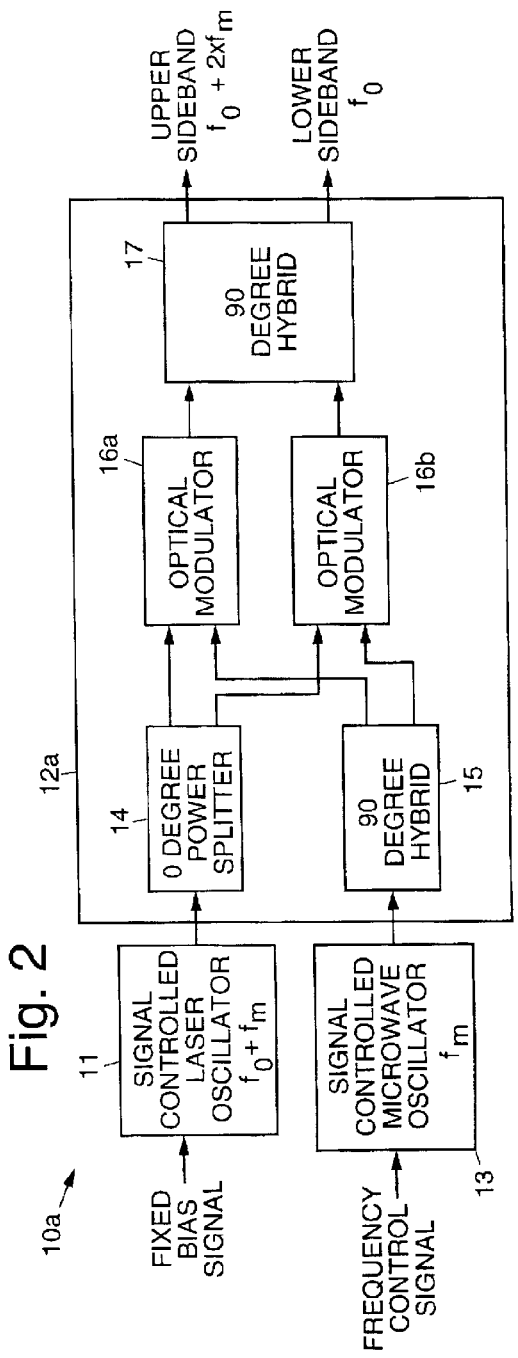
FIG. 2 illustrates a second exemplary embodiment of a virtually coherent signal controlled laser oscillator employing an optical single sideband mixer.

The single sideband mixing function provided by the single sideband mixer 12 shown in FIG. 1 may also be implemented by means of an optical single sideband mixer 12a having an exemplary configuration as shown in FIG. 2. More particularly, FIG. 2 illustrates an exemplary embodiment of a virtually coherent signal controlled laser oscillator 10a employing the optical single sideband mixer 12a.

The exemplary embodiment of a virtually coherent signal controlled laser oscillator 10a comprises a signal controlled laser oscillator 11 that receives a fixed bias input signal, and a signal controlled microwave oscillator 13 having a frequency control input signal. The signal controlled laser oscillator 11 outputs an optical frequency, $f_0$. The signal controlled microwave oscillator 13 outputs a microwave frequency, $f_0+f_m$.

Outputs of the signal controlled laser oscillator 11 and signal controlled microwave oscillator 13 are input to the optical single sideband mixer 12a. The radio frequency single sideband mixer 12a comprises a zero (0) degree power splitter 14, a ninety (90) degree hybrid coupler 15, two optical modulators 16a, 16b, and an output ninety (90) degree hybrid coupler 17.

The zero (0) degree power splitter 14 receives the output from the signal controlled laser oscillator 11, and the ninety (90) degree hybrid coupler 15 receives the output from the signal controlled microwave oscillator 13. Respective first outputs of the zero (0) degree power splitter 14 and ninety (90) degree hybrid coupler 15 are input to first inputs of two optical modulators 16a, 16b. Respective second outputs of the zero (0) degree power splitter 14 and ninety (90) degree hybrid coupler 15 are input to second inputs of the two optical modulators 16a, 16b.

Respective outputs of the two optical modulators 16a, 16b are coupled to inputs of the output ninety (90) degree hybrid coupler 17. The output ninety (90) degree hybrid coupler 17 outputs upper sideband and lower sideband output signals. The upper sideband output signal is at frequency $f_0+2\times f_m$ and the lower sideband output signal is at frequency $f_0$.

The hybrid optical-microwave single sideband mixer 11a illustrated in FIG. 2 is new art in the context of the present invention along with that of the virtually coherent signal controlled laser oscillator 10. Either desired sideband may be derived from this mixer 11a by selection of the appropriate signal phasing at the optical mixer inputs or outputs.

Thus, improved virtually coherent signal controlled laser oscillators have been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A virtually coherent signal controlled laser oscillator comprising:
    a signal controlled laser oscillator that receives a fixed bias input signal and outputs an optical frequency signal $f_0+f_m$;
    a signal controlled microwave oscillator that receives a frequency control input signal and outputs a microwave frequency signal, $f_m$; and
    a single sideband mixer that processes the signal output by the laser oscillator and microwave oscillator to output a signal controlled optical frequency signal.

2. The virtually coherent signal controlled laser oscillator recited in claim 1 wherein the single sideband mixer comprises an optical single sideband mixer comprising:
    a zero degree power splitter coupled to an output of the signal controlled laser oscillator;
    a ninety degree hybrid coupler coupled to an output of the signal controlled microwave oscillator;
    first and second optical modulators having first inputs coupled to first outputs of the power splitter and hybrid coupler, and having second inputs coupled to second outputs of the power splitter and hybrid coupler; and
    an output ninety degree hybrid coupler coupled to outputs of the first and second optical modulators for outputting upper sideband and lower sideband output signals.

3. The virtually coherent signal controlled laser oscillator recited in claim 2 wherein the upper sideband output signal is at frequency $f_0+2\times f_m$ and the lower sideband output signal is at frequency $f_0$.

4. A virtually coherent signal controlled laser oscillator comprising
    a signal controlled laser oscillator that receives a fixed bias input signal that outputs an optical frequency, $f_0$;
    a signal controlled microwave oscillator having a frequency control input signal that outputs a microwave frequency, $f_m$;
    a single sideband mixer that comprises a radio frequency single sideband mixer comprising:
    a zero degree power splitter coupled to an output of the signal controlled laser oscillator;
    a ninety degree hybrid coupler coupled to an output of the signal controlled microwave oscillator;
    first and second optical modulators having first inputs coupled to first outputs of the power splitter and hybrid coupler, and having second inputs coupled to second outputs of the power splitter and hybrid coupler; and
    an output ninety degree hybrid coupler coupled to outputs of the first and second optical modulators for outputting upper sideband and lower sideband output signals.

5. The virtually coherent signal controlled laser oscillator recited in claim 4 wherein the upper sideband output signal is at frequency $f_0+2\times f_m$ and the lower sideband output signal is at frequency $f_0$.

* * * * *